United States Patent [19]

Mogi et al.

[11] 4,217,552

[45] Aug. 12, 1980

[54] RECEIVER

[75] Inventors: Takao Mogi, Tokyo; Koji Morita, Kodaira; Hisao Okada, Yokohama, all of Japan

[73] Assignee: Sony Corporation, Tokyo, Japan

[21] Appl. No.: 942,531

[22] Filed: Sep. 15, 1978

[30] Foreign Application Priority Data

Sep. 28, 1977 [JP] Japan .................................. 52-116375

[51] Int. Cl.$^2$ ............................................. H04B 1/32
[52] U.S. Cl. ................................ 455/164; 455/192; 455/259; 455/263
[58] Field of Search ............... 325/457, 469, 470, 335, 325/418, 420–423; 358/193, 195

[56] References Cited

U.S. PATENT DOCUMENTS

| | | | |
|---|---|---|---|
| 2,951,150 | 8/1960 | Rennenkampf | 325/437 |
| 3,388,331 | 6/1968 | Rawley | 325/470 |
| 3,864,636 | 2/1975 | Fukuda et al. | 325/470 |
| 3,936,753 | 2/1976 | Clark | 325/470 |
| 3,988,681 | 10/1976 | Schürmann | 325/470 |
| 4,004,231 | 1/1977 | Elshuber et al. | 325/469 |
| 4,008,436 | 2/1977 | Fujita | 325/470 |
| 4,009,442 | 2/1977 | Von Brömssen | 325/470 |

*Primary Examiner*—Marc E. Bookbinder
*Attorney, Agent, or Firm*—Lewis H. Eslinger; Alvin Sinderbrand

[57] ABSTRACT

A digital tuning receiver having an electrically tuneable tuner and an AFT circuit is driven in a unidirectional sweep by the D/A converted output of a reversible counter. The reversible counter continues to count input pulses, and the unidirectional sweep continues until stopped by the reception of a signal which produces a first signal from an AFT frequency discriminator followed within a predetermined time by a second signal of opposite polarity from the AFT frequency discriminator. The number stored in the stopped reversible counter may be further adjusted by AFT signals and stored for later recall. If the second signal is not received within a predetermined time, as occurs with spurious beat signals, the sweep is not stopped but continues until a proper signal is received.

11 Claims, 35 Drawing Figures

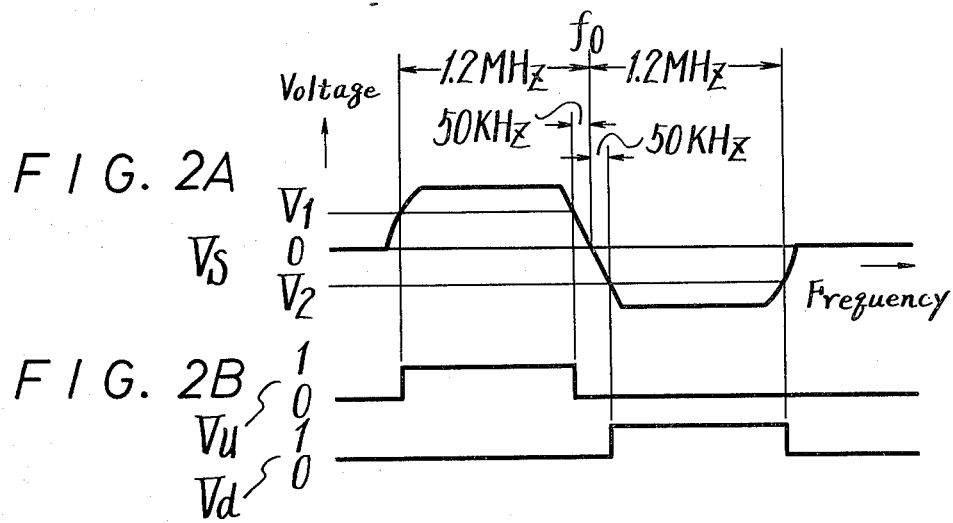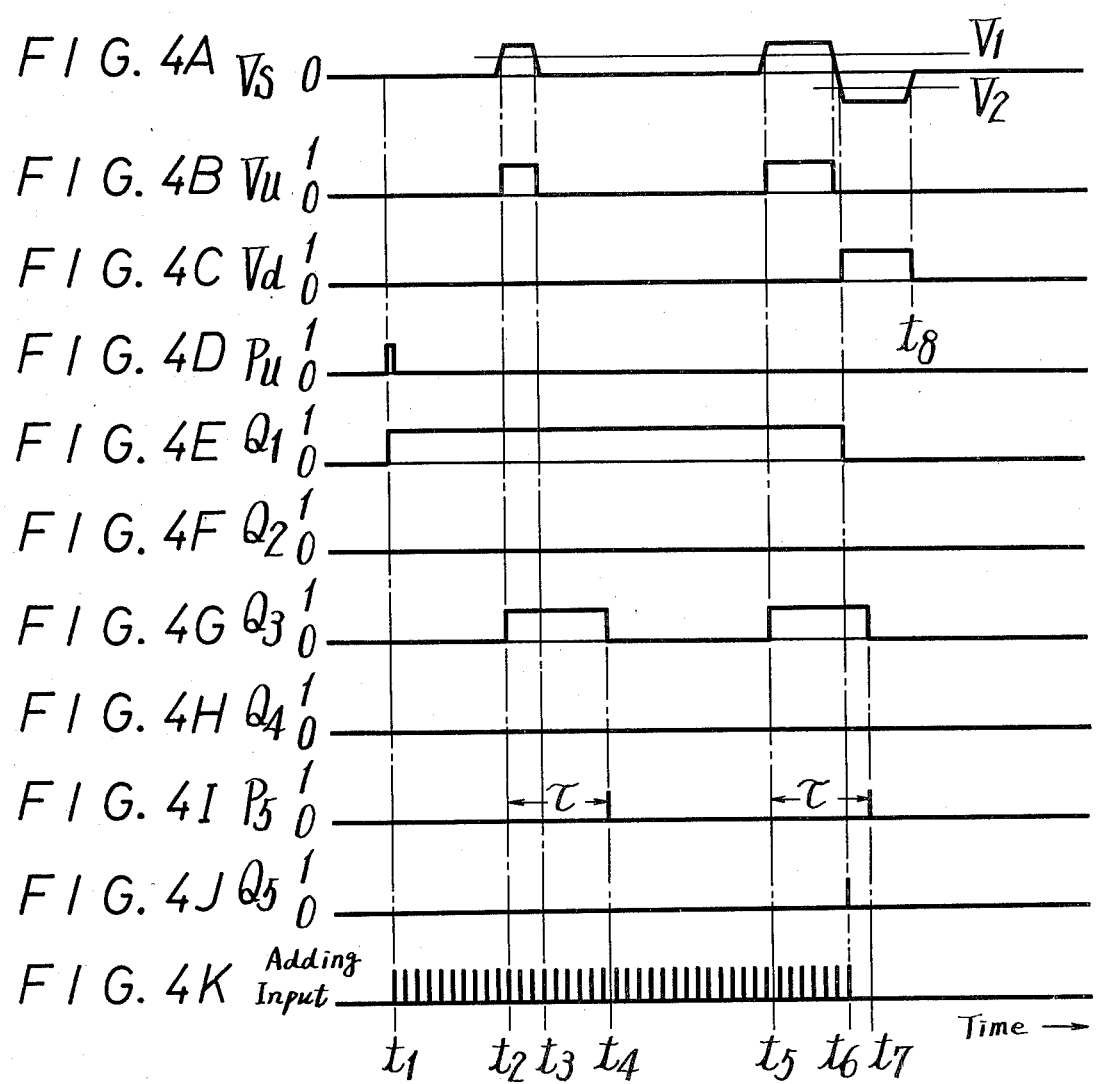

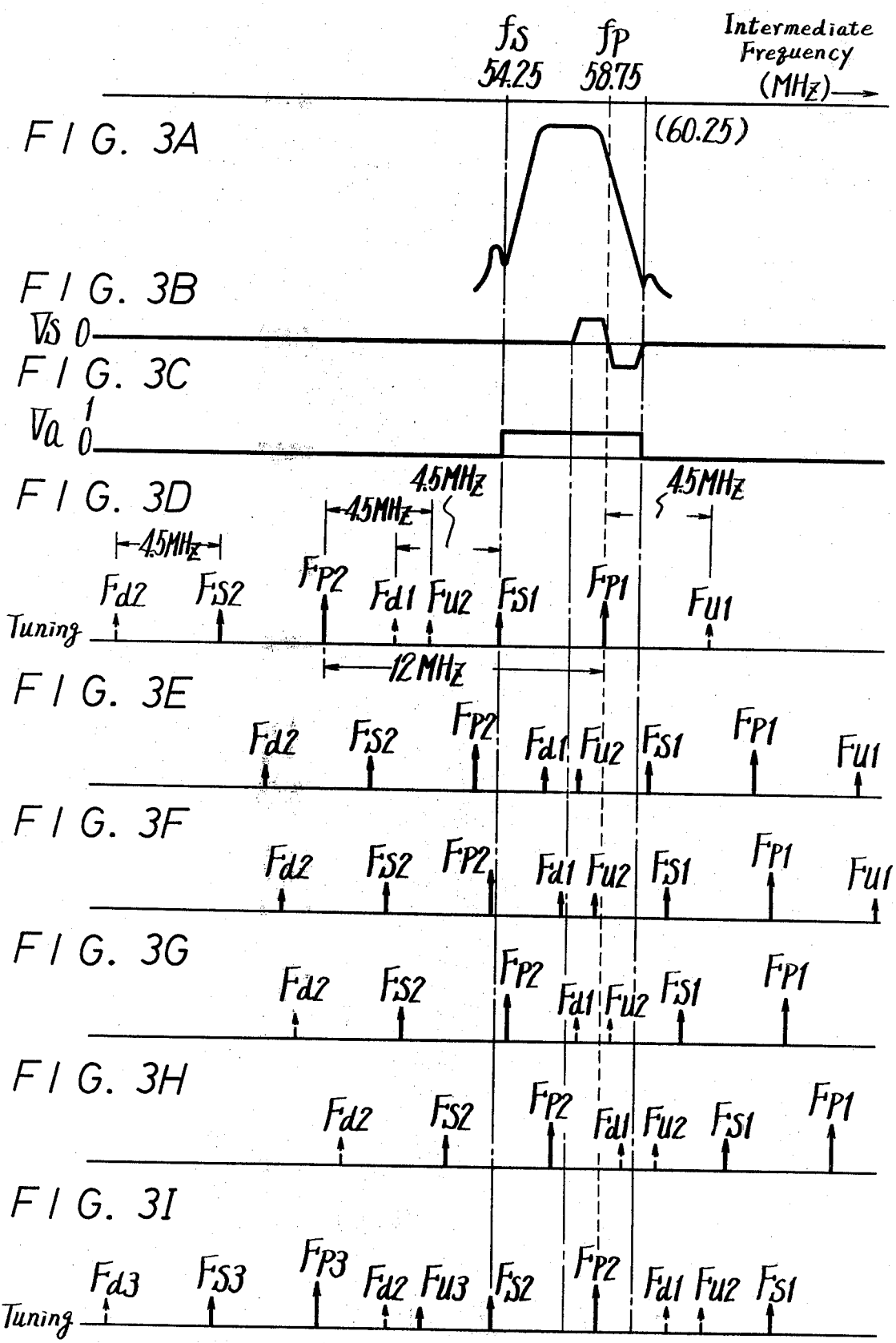

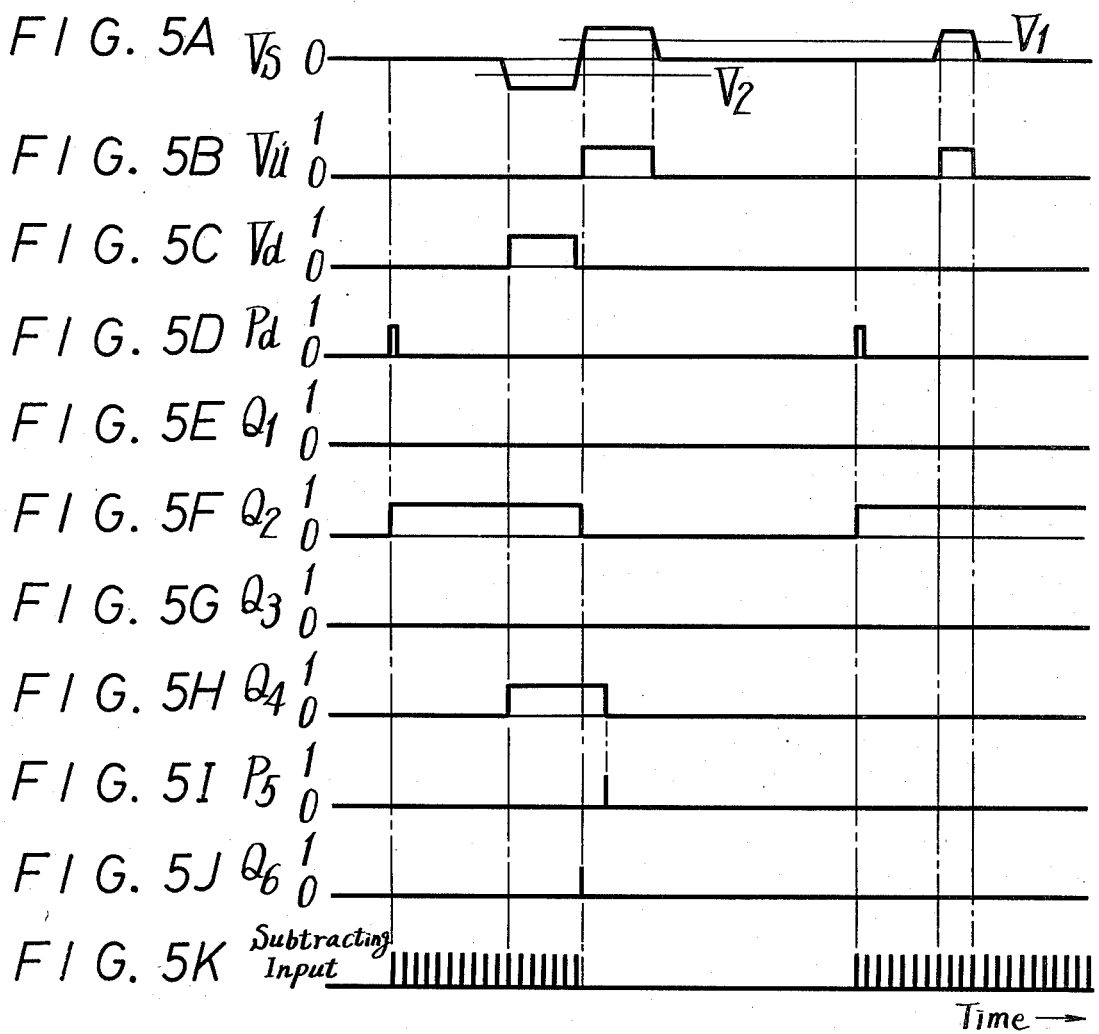

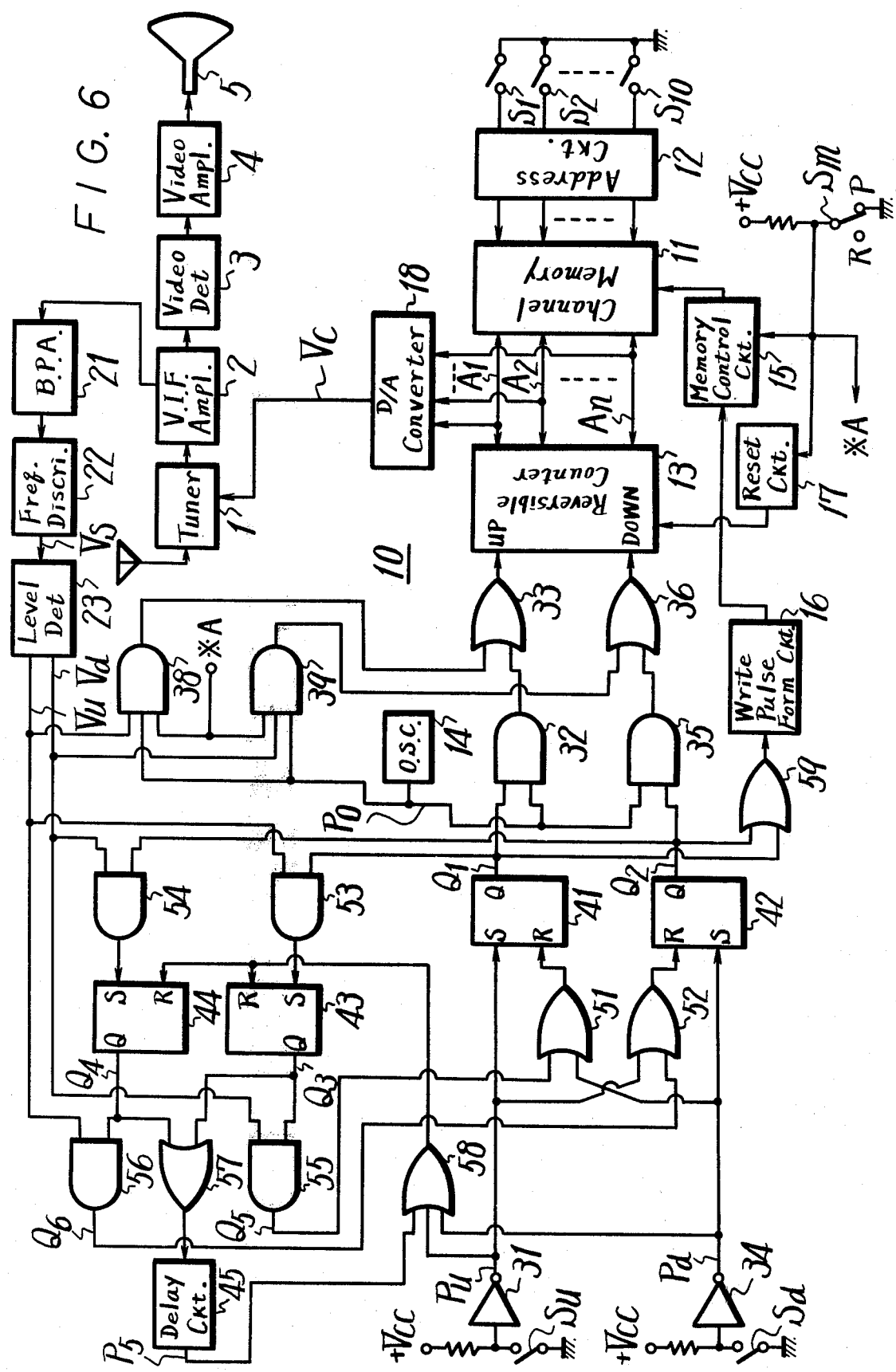

RECEIVER

BACKGROUND OF THE INVENTION

1. Field of the Invention

The present invention relates generally to a digital tuning receiver, and is directed more particularly to an AFT circuit thereof.

2. Description of the Prior Art

A prior art television receiver which uses a digital tuning system is described with reference to FIG. 1. An electronic tuner 1 is electronically tuneable using, for example, a variable capacitance diode (not shown) as a resonant element in its respective tuning circuit. The electronic tuner 1 is tuned by a tuning voltage $V_c$ generated by a tuning control circuit shown generally at 10. The tuning control circuit 10 has two modes of operation. In a first mode, tuning is swept smoothly upward or downward under the control of up-sweep switch $S_u$ and down-sweep switch $S_d$. When the appropriate switch is operated, pulses from pulse oscillator 14 are counted up or counted down in a reversible counter 13. The digital number stored in reversible counter 13 is D to A converted in D/A converter 18 to generate the channel selecting voltage $V_c$. When a channel is located by the sweep method, the sweep is automatically stopped and the digital number in reversible counter 13 may optionally be stored in a channel memory 11.

In the second mode of operation, tuning control circuit 10 selects channels previously stored in channel memory 10 under control of channel switches $S_1$–$S_{10}$. In this case, the digital number previously stored in channel memory 11 for a given channel is read out, D to A converted in D/A converter 18 and thus directly generates channel selecting voltage $V_c$ to tune tuner 1 to the selected channel.

In each mode of operation, an automatic fine tuning device compensates for minor misalignment of the tuner by correcting the digital number employed in generation of channel selecting voltage $V_c$. A conventional video intermediate frequency (VIF) amplifier 2 is connected to electronic tuner 1, a video detector 3 is connected to the VIF amplifier 2, a video amplifier 4 is connected to the video detector 4, and the output signal from the video amplifier 4 is applied to a television picture tube 5. Upon channel selection, the digital channel data $A_1$–$A_n$ from channel memory 11 is connected to D/A converter 18 which produces the channel selecting voltage $V_c$ corresponding to the desired broadcast channel. The channel memory 11 contains addresses whose number corresponds to TV channels to be received, for example, TV channel 10. Memory 11 is preferably non-volatile in order to retain the contents therein even in the event that power is lost. An addressing circuit 12 is provided to which channel selecting switches $S_1$ to $S_{10}$ are connected. When one of the switches $S_1$ to $S_{10}$ is operated, a corresponding channel address in memory 11 is selected and connected to D/A converter 18. A reversible counter 13 is employed to initially generate the codes $A_1$ to $A_n$ for the sweep mode and for channel selection. A pulse oscillator or generator 14 supplies pulses $P_o$ to reversible counter 13. A memory control circuit 15 controls the storage of addresses from reversible counter 13 in channel memory 11. A mode switch $S_m$ determines whether tuner 1 is scanned looking for a signal or whether it is controlled by channel memory 11. By placing mode switch $S_m$ in the R position, the apparatus is placed in a write-in (preset) mode in which scanning is performed until a signal having a predetermined characteristic is found, and the scanning is then stopped and the digital value representing the channel is stored in channel memory 11. When switch $S_m$ is placed in the P position, the apparatus is placed in a read-out (tuning) mode in which tuning is controlled by channel memory 11 15.

A write pulse forming circuit 16 generates a pulse which enables memory control circuit 15 to store the number from reversible counter 13 in channel memory 11. A reset circuit 17 generates a reset pulse under control of mode switch $S_m$ to erase the number in reversible counter 13.

In FIG. 1, there are also provided circuits 21 to 23 which receive the output signal from the VIF amplifier 2 and produce the VIF signal from the VIF amplifier 2 is applied through a band pass amplifier 21 of AFT circuit 70 to a frequency discriminator 22 which then produces a typical S-shaped AFT voltage $V_s$ as shown in FIG. 2A. This voltage $V_s$ is fed to a level detecting circuit 23 which has threshold levels $V_1$ and $V_2$ and produces the AFT signals $V_u$ and $V_d$ as shown in, for example, FIG. 2B when the S-shaped voltage $V_s$ exceeds the positive threshold $V_1$ or the negative threshold $V_2$. AFT signal $V_u$ becomes 1 in the frequency range between $(f_o-1.2\ MH_z)$ and $(f_o-50\ KH_z)$ where $f_o$ represents the normal tuning point or frequency and becomes 0 in the frequency ranges other than the above frequency range, while the AFT signal $V_d$ becomes 1 in the frequency range between $(f_o+50\ KH_z)$ and $(f_o+1.2\ KH_z)$ and becomes 0 in the other frequency ranges. In this case, the frequency range $(f_o\pm 50\ KH_z)$ become a tuning range.

In FIG. 1, a logic circuit formed of circuit elements 31 to 39 controls reversible counter 13 and write pulse forming circuit 16. When the switch $S_u$ or $S_d$ is placed in the ON position, a train of pulses $P_o$ from pulse oscillator 14 is supplied to the up or down input of counter 13.

Accordingly, when television channels are to be located by sweeping, the mode switch $S_m$ is placed in the P position with its movable element in contact with its preset contact P. Counter 13 is reset by a reset pulse generated by reset circuit 17 due to switching mode switch $S_m$ into the P position. Channel memory 11 is placed in the write-in mode by the memory control circuit 15.

Thus, when switch $S_1$ and up-sweep switch $S_u$ are both operated, the address corresponding to the switch $S_1$ in channel memory 11 is addressed through addressing circuit 12 to receive and store the digital number generated in reversible counter 13. The output from the inverter 31 becomes 1 upon operation of switch $S_u$. This enables one input of AND gate 32. Pulses $P_o$ from pulse oscillator 14 are supplied through AND gate 32 and OR gate 33 to the UP input of reversible counter 13. Thus, the number is reversible counter 13 increases sequentially from zero [00---0]. The digital number in reversible counter 13, fed to the D-A converter 18, produces the channel selecting voltage $V_c$ corresponding to the bits $A_1$ to $A_n$ of reversible counter 13. This voltage $V_c$ increases by $\Delta V$ each time the content of the counter 13 increases by 1. As a result, the frequency to which the tuner 1 is tuned increases sequentially to achieve an upward sweep of the received frequency.

If the above sweep operation is performed in the Tokyo area which has a TV channel, for example, when the station broadcasting channel 1 is received, up-sweep switch $S_u$ is released. Thus, the tuning for the desired channel can be achieved. When the up-sweep switch $S_u$ is released slightly late and hence the received frequency is higher than the desired frequency, down-sweep switch $S_d$ may be operated. Down-sweep switch $S_d$ causes inverter 34 to generate a 1 which enables one input of AND gate 34. A train of pulses $P_o$ from pulse oscillator 14 is fed through the AND gate 35 and the OR gate 36 to the down input of reversible counter 13. Thus, channel selecting voltage $V_c$ is swept lower to achieve fine tuning of the received frequency.

When the switch $S_u$ (or $S_d$) is released, the output from AND gate 37 becomes 1. This enables a first input of AND gates 38 and 39. If the received frequency is a little lower than the desired frequency, the AFT signal $V_u$ is 1 at this time. AFT signal $V_u$ enables a second input of AND gate 39. With two of its inputs enabled, AND gate 39 connects a train of pulses $P_o$ from pulse oscillator 14 through OR gate 33 to the up input of reversible counter 13. This causes the tuning frequency to increase. When the tuning is moved upward to within 50 $KH_z$ of channel 1, the AFT output becomes 0. This inhibits AND gate 39 and halts further increase in the number in reversible counter 13. Similarly, if the received frequency is a little higher than the desired frequency, the AFT signal $V_d$ is 1, the trains of pulses $P_o$ from pulse oscillator 14 is delivered through AND gate 39 and OR gate 36 to the down input of reversible counter 13 when $V_u=V_d=0$, the received frequency is within $\pm 50$ $KH_z$ of the precise frequency $f_o$. A frequency deviation of no more than 50 $KH_z$ is considered correct tuning and has no substantial effect on the received picture.

Write pulse forming circuit 16 is enabled by the 1 from AND gate 37 at the end of operation of up-sweep switch $S_u$ or down-sweep switch $S_d$. Write pulse forming circuit 16 applies a delay long enough to permit the AFT circuit 70 to complete its fine tuning function and then produces a write pulse. The write pulse from the write pulse forming circuit 16 is fed through the memory control circuit 15 to the channel memory 11 to erase the content thereof at the address designated by switch $S_1$ and to write the contents of reversible counter 13 into that address. Accordingly, the part of the channel memory 11 corresponding to the address designated by the switch $S_1$ contains channel selecting codes $A_1$ to $A_n$ corresponding to the channel selecting voltage $V_c$ for channel 1.

Next, switches $S_2$ and $S_u$ may be operated. The address of memory 11 corresponding to the switch $S_2$ is designated for change and the content of the counter 13 reversible is further increased from the value stored in it from the preceding operation. The selecting voltage $V_c$ continues to sweep the received frequency higher until the next broadcast station above channel 1, for example, channel 3 in the Tokyo area is received. Up-sweep switch $S_u$ is released, a delay is imposed by write pulse forming circuit 16 to permit completion of the AFT operation, then digital number $A_1$-$A_n$ in reversible counter 13, corresponding to channel 3 is written into channel memory 11 at the address designated by switch $S_2$. Similarly, the remaining television channels for a given area can be preset in memory 11.

When mode switch $S_m$ is placed in the R position, and one of channel selecting switches $S_1$ to $S_{10}$ corresponding to a desired channel is operated. Channel memory 11 is place in its read-out mode by memory control circuit 15. At this time, if switch $S_2$, for example, operated, the number stored in the corresponding address channel memory 11 corresponding to channel 3 is read out. The read-out codes $A_1$ to $A_n$ are fed through the counter 13 to the D-A converter 18 to generate the channel selecting voltage $V_c$ which is then fed to the tuner 1. Thus, the channel 3 can be received.

Further, in this case if the received frequency is by mistuned by more than 50 $KH_z$ due to temperature variation in electronic tuner an AFT voltage $V_u$ or $V_d$ is generated as previously described. An appropriate amount is added to or subtracted from the number in reversible counter 13 to correct the selecting codes $A_1$ to $A_n$, which are fed from the counter 13 to the D-A converter 18 until the AFT voltage is removed.

According to the prior art tuning control circuit 10, however, upon sweeping the received frequency in the presence of a strong signal which is not subjected to automatic gain control (AGC), false AFT signals are generated.

The frequency response of the VIF amplifier 2 is as shown in FIG. 3A. The pass band of band pass amplifier is shown between dot-dash lines 72a and 72b in FIGS. 3B-3I. The S-shaped voltage $V_s$ which is generated when the picture carrier signal $F_{p1}$, for example, of channel 1 is swept past the band pass amplifier 21 is shown in FIG. 3B. In the figures, $f_s$ and $f_p$ represent a normal sound intermediate frequency and a normal video intermediate frequency, respectively.

For the sake of simplicity it is assumed that for the above characteristic an AGC voltage $V_a$ for the tuner 1 is such that the AGC voltage $V_a$ is 1 only when the sound carrier frequency $f_s$ signal or video carrier frequency $f_r$ in a received signal are in the frequency range of VIF amplifier 2 between 54.25 $MH_z$ and 60.25 $MH_z$ and is 0 in all other frequency bands as shown in FIG. 3C. accordingly, when $V_a=1$, the AGC operation is carried out and hence the gain of the tuner 1 is reduced, while when $V_a=0$ no AGC operation is carried out and hence the tuner 1 is at full gain.

FIGS. 3D-3I show a sequence of conditions in which the signals and beat signals of two adjacent channels are swept in the rightward direction past the stationary frequency response curves of VIF amplifier 2 and band pass amplifier 21. For normal reception, as shown in FIG. 3D, sound and video intermediate frequency signals $F_{s1}$ and $F_{p1}$ in the desired channel are positioned at the frequencies $f_s$ and $f_p$. Further, in normal television broadcast, band allocations, only alternate channels are occupied in a given area. This provides a guard band of 6 $MH_z$ between adjacent allocated channels. Thus the nearest video intermediate frequency signals $F_{s2}$ and $F_{p2}$ of an adjacent station are positioned 12 $MH_z$ from signals $F_{s1}$ and $F_{p1}$.

A strong signal containing $F_{s1}$ and $F_{p1}$ can generate beat signals $F_{u1}$ and $F_{d1}$ a television receiver due to mutual modulation of the carrier signals. Beat signal $F_{u1}$ is positioned 4.5 $MH_z$ above $F_{s1}$. Beat signal $F_{d1}$ is positioned 4.5 $MH_z$ below $F_{p1}$. Similarly, quasi-signals $f_{u2}$ and $F_{d2}$ are generated by mutual modulation of signals $F_{s2}$ and $F_{p2}$, respectively and are positioned 4.5 $MH_z$ above and below them respectively.

When a television is properly tuned as shown in FIG. 3D, $V_a=1$ and the AGC is applied to the electronic tuner 1 and hence its gain is low. $F_{u1}$ to $F_{d2}$ are attenuated to such a low level that they are essentially not a factor. This is illustrated in FIGS. 3D and 3G-3I by showing these signals as broken arrows.

When tuning has progressed to the condition shown in FIG. 3E, signals $F_{s1}$ and $F_{p1}$ are moved outside the passband of VIF amplifier 2 shown in FIG. 3A but adjacent signals $F_{s2}$ and $F_{p2}$ have not yet been moved inside the passband. Since there is neither a picture nor a sound carrier within the VIF passband, the AGC voltage is low. Thus, no AGC is applied to the electronic tuner 1 and hence electronic tuner 1 and other circuits are at full gain with the result that the quasi-signals $F_{d1}$ and $F_{u2}$ are generated within the VIF passband and also signal $F_{u2}$ is within the bandpass of band pass amplifier 21. Note that signal $F_{u2}$ is between band edge 72b and cross-over point 72c. Thus, a positive AFT voltage $V_s$ is generated by $F_{u2}$ in this location. This time is indicated at time $t_{10}$ in FIGS. 4A-4K.

A short time later, denoted as $t_{11}$ in FIG. 3F and FIGS. 4A-4K, tuning has progressed to the point that $F_{u2}$ is approaching crossover line 72c (FIG. 3F). But note that, at this same time, the picture carrier signal $F_{p2}$ is just outside the edge of the VIF passband. An instant later, at time $t_{12}$ beat signal $F_{u2}$ is located between crossover line 72c and band edge 72a. This position of beat signal $F_{u2}$ would produce a negative voltage $V_s$ (FIG. 3B) except for the fact that, just as signal $F_{u2}$ crossed crossover line 72c, picture carrier $f_{p2}$ entered the VIF passband. The presence of $F_{p2}$ in the VIF passband reestablishes a strong AGC signal. Thus signal $F_{u2}$ is suppressed, as shown by the broken arrow, to such an extent that it is incapable of generating a negative alternation of $V_s$.

Still later, at time $t_{13}$, beat signal $F_{u2}$ is outside the VIF pass band and $F_{d1}$ is located between crossover line 72c and 72a. However, as before, the presence of the picture carrier $F_{p2}$ within the VIF passband suppresses beat signal $F_{d1}$ and prevents generation of a negative component of $V_s$.

With continued tuning, picture carrier signal $F_{p2}$ enters the passband of the band pass amplifier 21 between band edges 72b and 72a. At time $t_{14}$ (FIGS. 3I and 4A-4K), the picture carrier signal $F_{p2}$ is aligned with crossover line 72c. Unless disturbed, the AFT system will maintain this condition.

As a result, when the received frequency is swept from left to right, as shown in FIGS. 4A to 4C, a false S-shaped voltage $V_u$ having only a positive alternation corresponding to FIGS. 3F and 3E is generated between times $t_2$ and $t_3$, and then the normal positive and negative S-shaped voltage $V_s$ and AFT signals $V_u$ and $V_d$ are obtained in correspondence with FIGS. 3I between times $t_5$ and $t_8$.

If the direction of frequency sweep is reversed, the sequence of positions shown in FIGS. 3I to 3D produce the same S-shaped voltage $V_s$ and AFT signals $V_u$ and $V_d$ as previously described but in the reverse order as shown in FIGS. 5A to 5C.

When a false signal $V_u$, such as at times $t_{10}$-$t_{11}$, other than the normal AFT signals $V_u$ and $V_d$ is generated as set forth above, the prior art tuning control circuit 10 stops the sweep operation the frequency position at which the false AFT signal $V_u$ becomes "0". Accordingly, receiver tuning stops on a false signal, such as $F_{u2}$. This mis-tuning gives a picture in which proper synchronization cannot be achieved, the higher frequency components are missing and no color appears. The resulting picture quality is seriously deteriorated with the normal picture screen.

OBJECTS AND SUMMARY OF THE INVENTION

Accordingly, it is an object of the invention to provide a novel digital tuning receiver free from the defects inherent to the prior art.

It is another object of the invention to provide a digital tuning receiver in which AFT operation is prevented from being carried out erroneously by a beat signal.

It is a further object of the invention to provide a receiver for automatic tuning in which AFT operation is performed only with a normal AFT signal by utilizing the difference between normal and spurious AFT signals.

According to an aspect of the present invention, an automatic tuning receiver comprises: an electronic tuner, an intermediate frequency amplifier having a bandwidth, sweeping means for sweeping the tuning frequency of the tuner in a unidirectional sweep, stopping means for stopping the sweep when a signal reaches a fixed frequency within the bandwidth and inhibiting means for inhibiting said stopping means in response to a characteristic of the signal.

According to a feature of the invention, an up flip-flop or a down flip-flop is set by operation of an up-sweep or down-sweep switch respectively. The set flip-flop enables counting in the appropriate direction in an up-down counter which generates a digital word used for controlling the frequency.

When an AFT signal of either polarity is obtained, another flip-flop is set which begins a preset waiting period for the arrival of an AFT signal of the opposite polarity. If the opposite polarity AFT signal is received within the preset waiting period, the initially set flip-flop is reset and counting is halted. If the opposite polarity AFT signal is not received within the waiting period, as is the case with spurious beat signals, the effect of the first portion of the AFT signal is cancelled. In this event, scanning is continued until an AFT signal having a first polarity followed within a predetermined time by a second polarity is received.

According to a further feature of the invention there is provided a receiver for automatic tuning which comprises an electronic tuning tuner having at least one signal-controlled variable reactance element converting an input radio frequency signal to an intermediate frequency signal, a demodulating circuit connected to the tuner for reproducing a desired signal, a frequency discriminating circuit connected to the tuner for generating an up-signal when a received frequency is lower than a center frequency and a down-signal when the received frequency is higher than the center frequency, a pulse generator for producing counting pulses, a counter for counting said counting pulses from the pulse generator; a tuning frequency controlling circuit connected to the tuner for controlling a tuning frequency of the tuner in response to a condition of the counter, a first flip-flop circuit for controlling a supply of counting pulses to the counter, and an up-sweep starting or down-sweep starting device for setting the first flip-flop circuit, characterized in that the receiver further comprises a second flip-flop circuit which is set when a set output of the first flip-flop circuit and the up-signal or down-signal or the frequency discriminating circuit exist at the same time, and a resetting circuit for resetting the first flip-flop circuit when a set output of the second flip-flop circuit and the down-signal or up-signal of the frequency discriminating circuit exist at the same time.

The other objects, features and advantages of the present invention will become apparent from the following description taken in conjunction with the accompanying drawings through which the like reference numerals and symbols designate the same elements.

BRIEF DESCRIPTION OF THE DRAWINGS

FIGS. 2A, 2B, FIGS. 3A to 3I, FIGS. 4A to 4K, and FIGS. 5A to 5K, inclusive, are waveform diagrams used for explaining the above prior art and the present invention; and FIG. 6 is a logic diagram showing an embodiment of a digital tuning receiver according to the present invention.

DESCRIPTION OF THE PREFERRED EMBODIMENT

Figure 1:
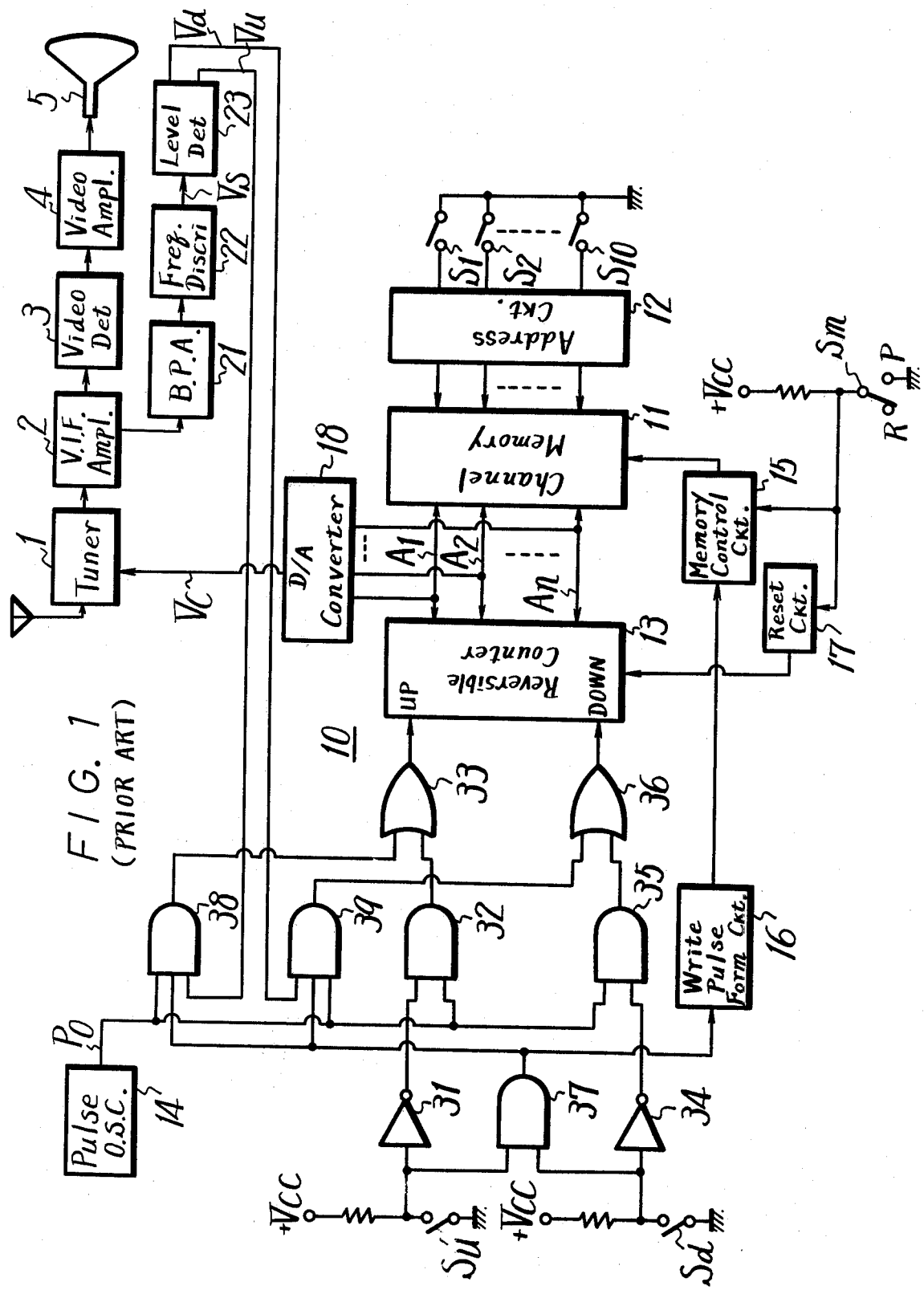
FIG. 1 is a logic diagram showing a prior art digital tuning receiver.

As described in connection with FIGS. 3 to 5, when the received frequency is swept in one direction, an AFT signal indicating tuning through a television broadcast channel, signals $V_u$ and $V_d$ of opposite polarity are obtained. However, a false AFT signal generated by a beat signal, for example $F_{u2}$, produces only a single signal $V_u$ or $V_d$ without being followed within a predetermined time by the other of $V_d$ or $V_u$.

According to the invention, once an up-sweep or down-sweep is initiated, the sweep is continued until the proper sequence AFT signals $V_u$ and $V_d$ is received. If only one AFT signal $V_u$ or $V_d$ is obtained, the sweep is continued at a constant speed. When the inverse AFT signal $V_d$ or $V_u$ is obtained within a predetermined time after receiving the first AFT signal the sweep is stopped.

An embodiment of the digital tuning receiver according to the present invention is described with reference to FIG. 6 in which the elements corresponding to those of FIG. 1 have the same reference numerals and their detailed explanation is therefore omitted.

An up-start flip-flop circuit 41 and a down-start flip-flop circuit 42 control the connection of pulses $P_u$ through AND gates 32 and 35 and OR gates 33 and 36 to the up and down inputs respectively of reversible counter 13. The appropriate one of up-start and down-start flip-flop circuits 41, 42, initially reset, is triggered into the set condition by a start signal connected from up-sweep switch $S_u$ or down-sweep switch $S_d$ through inverter 31 or 34 to the appropriate set input S. Once set, up-start or down-start flip-flop circuit 41 or 42 remains set until reset by outputs from both stop flip-flop circuits 43 and 44 as will be explained.

Initially, up-start flip-flop circuit 41, down-start flip-flop circuit 42, and stop flip-flop circuits 43 and 44 are all reset as shown prior to $t_1$ by $Q_1$–$Q_4$ in FIGS. 4E–4H. assume for purposes of illustration that switch $S_u$ is momentarily operated at time $t_1$. Inverter 31 produces an up-starting pulse $P_u$ for the up-sweep at time $t_1$ as shown in FIG. 4D. Starting pulse $P_u$ is supplied directly to the set input S of up-start flip-flop circuit 41 and through OR gate 52 to the reset input R of down-start flip-flop circuit 42. The set output $Q_1$ of up-start flip-flop circuit 41 enables one input of AND gate 32 which thereupon gates a train of pulses $P_o$ through OR gate 33 to the up input of reversible counter 13. Further, up-starting pulse $P_u$ is supplied through the OR gate 58 to reset input R of flip-flop circuits 43 and 44 to ensure that these circuits are reset. The condition of outputs $Q_1$–$Q_4$ after time $t_1$ is shown in FIGS. 4E–4H. The received frequency starts to increase due to the $P_o$ pulses being counted in reversible counter 13 at time $t_1$. At time $t_2$, the positive alternation of voltage $V_s$ is produced by the quasi-signal $F_{u2}$ and thereby the false AFT signal $V_u$ is generated. This false AFT signal $V_u$ and the output $Q_1$ from flip-flop circuit 41 are supplied to AND gate 53 and the output from the latter is applied to the set terminal S of stop flip-flop circuit 43. Output $Q_3$ from flip-flop circuit 43 becomes 1 at time $t_2$ as shown in FIG. 4G. Although AFT signal $V_u$ is also applied to AND gates 38, 53 and 56, since switch $S_m$ is in contact with its preset contact P to ground, AND gates 38 and 39 are inhibited. AND gate 56 also remains inhibited by the 0 output $Q_4$ from flip-flop circuit 44.

The output $Q_3$ from flip-flop circuit 43 is fed through OR gate 57 to delay circuit 45. A pulse $P_5$ is derived from delay circuit 45 at time $t_4$ after the time $t_2$. Time $t_4$ lags $t_2$ by a predetermined time period $\tau$ as shown in FIG. 4I. The predetermined time period $\tau$ is long enough to permit the occurrence of the opposite-polarity AFT signal before pulse $P_5$ is generated. If no opposite-polarity AFT signal occurs before the end of $\tau$, pulse $P_5$ is fed through OR gate 58 to the reset inputs of flip-flop circuits 43 and 44. AFT signal $V_u$ generated between the times $t_2$ and $t_3$ is the false AFT signal. No opposite-polarity AFT signal $V_s$ is provided following the AFT signal $V_u$. Thus, $V_d$ remains 0 and output $Q_3$ remains 1 until reset at $t_4$ enabling one input of AND gate 55, but the absence of $V_d$ at its other input keeps $Q_5$ at 0 as shown in FIG. 4J. Accordingly, the output $Q_3$ from the flip-flop circuit 43 becomes 0 at time $t_4$. With $Q_5$ maintained at 0, no reset signal is available for connection through OR gate 51 to the reset input R of up flip-flop circuit 41. Therefore the sweep is not stopped.

When real broadcast channel is received at a time $t_5$, the S-shaped voltage $V_s$ is produced and hence the positive going AFT signal $V_u$ is produced. Therefore, output $Q_3$ becomes 1 in to the manner previously described. In this case, since a real broadcast channel is being received, the positive-going AFT signal $V_1$ is replaced by negative going AFT signal $V_d$ at time $t_6$. The occurrence of AFT signal $V_d$ at $t_6$ enables the second input of AND gate 55 and generates the reset signal $Q_5$ which is connected through OR gate 51 to the reset input R of up flip-flop circuit 41. Up flip-flop circuit 41 is consequently reset and the 0 at its set output $Q_1$ inhibits AND gate 33 thus halting the further counting of pulses $P_o$ in reversible counter 13.

When the output $Q_1$ of flip-flop circuit 41 becomes 0, output $Q_1$ is fed through OR gate 59 to write pulse forming circuit 16 which then produces the write pulse. This write pulse is fed through memory control circuit 15 to the memory 11. As a result, the content of the counter 13 is written in the memory 11 as the selecting codes $A_1$ to $A_n$.

It is to be noted that reversible counter 13 is stopped only AFT signal $V_d$ is produced at the time $t_6$. The contents of reversible counter 13 at that time has overshot the zero crossing of AFT voltage $V_s$. However, the sweep is stopped on the first counting pulse $P_o$ after AFT signal $V_d$ is made 1 (refer to FIG. 4K). Therefore the tuning error is only one count of the pulses $P_o$ beyond the range of ($f_0 \pm 50$ KH$_z$). In addition, AFT operation is carried out every time the receiver is retuned to a station. Accordingly, even if the contents of channel memory 11 is incorrect due to the above slight mistuning, codes $A_1$–$A_6$ selected from channel memory 11 are corrected after being applied to reversible counter 13.

At time $t_7$, which follows time $t_5$ by the time period $\tau$, delay circuit 45 delivers the reset pulse $P_5$. Pulse $P_5$ is fed through OR gate 58 to the reset inputs of flip-flop circuits 43 and 44. Output $Q_3$ is reset to 0 at time $t_7$. If up-sweep switch $S_u$ is operated again, the upward sweep is continued until another real broadcast signal (not shown) is located. The sweep again is stopped and the number in reversible counter 13 is stored. FIGS. 4A to 4C show the change when the sweep is continued, which is similar to the change shown in FIGS. 5A to 5C.)

When the switch $S_d$ is operated, inverter 34 produces a starting pulse $P_d$ for the down-sweep as shown in FIG. 5D. In this case, circuits 42, 35, 36 and 54 perform functions in starting and stopping a down sweep which correspond to those described for the up sweep. During the down sweep, signals are as shown in FIG. 5, in which $Q_6$ represents an output from the AND-gate 56.

A stored broadcast channel can be selected by the switches $S_1$ to $S_{10}$. When switch $S_m$ is in contact with its receiving contact R. After the code $A_1$–$A_n$ is transferred into reversible counter 13, AND gates 38 and 39 deliver pulses $P_o$ controlled by AFT signals $V_u$ and $V_d$ respectively to appropriately increase or decrease the stored number to achieve correct fine tuning.

As described above, according to the present invention, by utilizing the difference between normal AFT signals $V_u$, $V_d$ and false AFT signal $V_u$ caused by the quasi-signal $F_{u2}$, a unidirectional sweep is not stopped by the presence of quasi-signal $F_{u2}$ but is continued until a real station, which provides normal AFT signals $V_u$ and $V_d$ is found. Thus, the present invention permits rapid and accurate location and tuning of a broadcast channel.

Channel memory 11 and addressing circuit 12 may be omitted without departing from the scope of the present invention. In that case, all channel selection is achieved by operation of up-sweep switch $S_u$ or down-sweep switch $S_d$ to increase or decrease the number stored in reversible counter 13.

Although the above description is given on a single preferred embodiment of the invention, it will be apparent that many modifications and variations could be effected by one skilled in the art without departing from the spirits or scope of the novel concepts of the invention.

We claim as our invention:

1. A receiver for automatic tuning of a radio frequency signal, comprising:
    an electronic tuning tuner having at least one signal-controlled variable reactance element for converting said radio frequency signal to an intermediate frequency signal;
    demodulating means connected to said tuner for reproducing a desired signal from said intermediate frequency signal;
    frequency discriminating means connected to said tuner for generating an up-signal when the converted radio frequency signal is lower than a center frequency and a down-signal when the converted radio frequency signal is higher than the center frequency;
    a pulse generator for producing counting pulses;
    a counter for counting said counting pulses from said pulse generator;
    tuning frequency controlling means connected to said tuner for controlling a tuning frequency of said tuner in response to a condition of said counter;
    a first flip-flop counter for controlling a supply of counting pulses to said counter;
    sweep starting means for setting said first flip-flop circuit to produce a first output therefrom;
    means responsive to said first output for unidirectionally sweeping said tuning frequency, said up-signal and said down-signal being sequentially produced within a predetermined time in response to sweeping past said radio frequency signal;
    a second flip-flop circuit which is set to produce a second output therefrom when said first output of said first flip-flop circuit and one of said up-and down-signals of said frequency discriminating means exist at the same time;
    resetting means for resetting said first flip-flop circuit when said second output of said second flip-flop circuit and the other of said up-and down-signals of said frequency discriminating means exist at the same time; and
    inhibiting means for resetting said second flip-flop circuit when a second of said up-and down-signals fails to occur within said predetermined time after the occurrence of a first of said up-and down-signals.

2. A receiver for automatic tuning according to claim 1, wherein said inhibiting means includes delay means connected to an output of said second flip-flop circuit for resetting said second flip-flop circuit after said predetermined period of time.

3. A receiver for automatic tuning according to claim 1, wherein said tuning frequency control means is a digital to analog converter.

4. An automatic tuning receiver for tuning a radio frequency signal comprising: an electronic tuner, an intermediate frequency amplifier having a bandwidth, sweeping means for sweeping the tuning frequency of said tuner in a unidirectional sweep past said radio frequency signal, means for automatic fine tuning said electronic tuner, said means for automatic fine tuning being operative to produce first and second sequential fine tuning signals within a predetermined time in response to sweeping said radio frequency signal past a fixed frequency within said bandwidth, stopping means for stopping said sweeping means in response to the sequential production of said first and second fine tuning signals, and inhibiting means for inhibiting said stopping means when said second signal does not occur within said predetermined time.

5. The receiver according to claim 4, wherein said sweeping means includes a reversible counter having an up-input and a down-input, a digital-to-analog converter effective to convert digital contents of said reversible counter into an analog voltage, voltage-controlled means responsive to said analog voltage for changing the tuning frequency of said electronic tuner, counting pulse generator means for generating a train of counting pulses, and first and second gating means for controlling the application of said counting pulses to said up-and down-inputs respectively, enabling means for enabling one of said first and second gating means to permit said reversible counter to count up or down, respectively.

6. The receiver according to claim 5, wherein said stopping means includes reset means to reset said enabling means and to stop counting in said reversible counter in response to said second fine tuning signal occurring within said predetermined time.

7. The receiver according to claim 6, wherein said stopping means includes means causing said means for automatic fine tuning to be operative for generating one of said first and second fine tuning signals in response to the location of said radio frequency signal within said bandwidth between first and second frequencies below said fixed frequency and for generating the other of said first and second fine tuning signals in response to the location of said radio frequency signal within said bandwidth between third and fourth frequencies above said fixed frequency, a first flip-flop circuit settable by said first fine tuning signal to produce a first output, a second flip-flop circuit settable by said second fine tuning signal to produce a second output, and an AND gate effective to be enabled by said first and second outputs to generate a reset signal which is operative to reset said enabling means.

8. The receiver according to claim 7, further comprising a delay circuit operative in response to either said first or said second output to generate a reset pulse for said first and second flip-flop circuits after a delay of said predetermined time.

9. The receiver according to claim 7, wherein said enabling means includes a switch, a third flip-flop circuit and means connected to said switch for setting said third flip-flop circuit to produce a third output, said third output being effective to enable said first gating means.

10. The receiver according to claim 4, wherein said radio frequency signal contains an information carrier and a beat signal, said means for automatic fine tuning being operative to generate said first and second sequential fine tuning signals during said unidirectional sweep when said signal is said information carrier and operative to generate only said first fine tuning signal in response to said beat signal.

11. Apparatus for controlling tuning of an electronically tunable tuner in a receiver comprising: an intermediate frequency amplifier having a bandwidth, sweep means for unidirectionally sweeping the tuning of said tuner in a frequency sweep, automatic fine tuner means responsive to a signal in a portion of said bandwidth to generate first and second sequential fine tuning signals within a predetermined time during said frequency sweep when said signal is an information carrier and to generate only said first fine tuning signal when said signal is a beat signal, and stopping means for stopping said sweep means in response to said first and second sequential fine tuning signals occurring within said predetermined time, said stopping means being insensitive to said first fine tuning signal alone, and means for continuing said unidirectional sweeping in response to a failure of said second fine tuning signal to occur within said predetermined time after said first fine tuning signal.

* * * * *